US00RE47399E

(19) United States
(12) Reissued Patent
Taylor

(10) Patent Number: US RE47,399 E
(45) Date of Reissued Patent: May 21, 2019

(54) METHOD AND APPARATUS FOR PROTECTING RADIO FREQUENCY POWER AMPLIFIERS

(71) Applicant: Maxim Integrated Products, Inc., San Jose, CA (US)

(72) Inventor: Stewart Sidney Taylor, Beaverton, OR (US)

(73) Assignee: Maxim Integrated Products, Inc., San Jose, CA (US)

(21) Appl. No.: 15/245,091

(22) Filed: Aug. 23, 2016

Related U.S. Patent Documents

Reissue of:
(64) Patent No.: 6,580,318
Issued: Jun. 17, 2003
Appl. No.: 09/802,416
Filed: Mar. 8, 2001

(51) Int. Cl.
*H03G 3/20* (2006.01)

(52) U.S. Cl.
CPC ..... *H03G 3/20* (2013.01)

(58) Field of Classification Search
CPC ..... H03G 3/20
USPC ..... 330/129, 207 P, 285, 289, 298; 327/65, 327/67, 69, 71, 82, 87, 89, 90
See application file for complete search history.

(56) References Cited

U.S. PATENT DOCUMENTS

| | | | | |
|---|---|---|---|---|
| 3,428,909 | A | 2/1969 | Kam et al. | |
| 4,742,312 | A * | 5/1988 | Osburn et al. | 330/298 |
| 5,315,268 | A * | 5/1994 | Botti et al. | 330/298 |
| 5,426,395 | A * | 6/1995 | Cygan | 330/207 P |
| 5,510,753 | A | 4/1996 | French | |
| 5,847,610 | A * | 12/1998 | Fujita | 330/298 |
| 6,038,432 | A * | 3/2000 | Onoda | 455/127 |
| 6,137,357 | A * | 10/2000 | Dekker | 330/129 |
| 6,188,277 | B1 * | 2/2001 | Borodulin et al. | 330/51 |
| 6,203,516 | B1 * | 3/2001 | Kepley | A61F 9/00745 604/22 |
| 6,329,880 | B2 * | 12/2001 | Akiya | 330/298 |

FOREIGN PATENT DOCUMENTS

GB 2250151 A 5/1992

* cited by examiner

*Primary Examiner* — My Trang Ton
(74) *Attorney, Agent, or Firm* — North Weber & Baugh LLP

(57) ABSTRACT

A power amplifier protection system to sense one or more operating conditions of a power amplifier and regulate the power of the input signal to the power amplifier as a response to one or more of the sensed operating conditions. This dynamic protection system may protect a power amplifier from failure by monitoring such operating conditions as power output and temperature and reducing the amplitude of the input signal if the power amplifier is operating beyond specified levels.

40 Claims, 6 Drawing Sheets

METHOD AND APPARATUS FOR PROTECTING RADIO FREQUENCY POWER AMPLIFIERS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*IDENTIFICATION UNDER 37 CFR 1.177(A)*

*This Reissue Application is a reissue of application Ser. No. 09/802,416, filed Mar. 8, 2001, which issued as U.S. Pat. No. 6,580,318.*

FIELD

The present invention pertains to power amplifiers and in particular to a method and apparatus to protect power amplifiers from failure caused by operational conditions.

BACKGROUND OF THE INVENTION

Radio frequency (RF) power amplifiers are known in the art for use in amplifying RF signals for broadcasting purposes, including radio and television. These amplifiers may be employed for broadcasting either analog or digital signals. In some applications, such as mobile communication systems, RF power amplifiers are frequently cycled, turned On and Off, during operation. The average power of these amplifiers is defined as the product of the duty cycle and the peak power. As the duty cycle of a RF power amplifier increases, so does its average power. As the average power of an amplifier increases it may be exposed to operating conditions which causes or accelerates its failure.

Typically, power amplifiers are designed to operate within certain current, voltage, temperature, and frequency limits. Operating a power amplifier beyond its designed limits exposes the amplifier to failure. Thus, power amplifier manufacturers typically specify the operating parameters or conditions for each particular type of power amplifier, including power dissipation and operating temperatures.

Manufacturers also typically over-design power amplifiers to withstand wide power and temperature variations. Designing such rugged power amplifiers tends to make them larger than otherwise necessary, more expensive, and may degrade their RF performance. Additionally, even ruggedly designed power amplifiers are susceptible to certain types of failures.

One such type of failure may occur when the output of the power amplifier is mismatched. That is, power amplifiers are often designed to operate with a particular impedance or termination value. For example, the output of a power amplifier may be designed to be coupled to a nominal 50 Ohm load or termination, such as an antenna with impedance of 50 Ohms. However, in an actual implementation, the power amplifier may be terminated with a substantially different terminating impedance value. Such mismatched termination may result in the power amplifier dissipating more power internally than what it was designed to dissipate. This may result in additional heat being generated which may cause the power amplifier to operate at temperatures higher than what it was designed to operate.

Another circumstance which may cause a power amplifier to fail may occur when the source and/or input voltage to the power amplifier changes during operation. That is, a power amplifier may be designed to operate within a certain voltage range; for instance 2.8 to 3.4 Volts DC. However, during operation, the source and/or input voltage to the power amplifier may increase beyond such range; for instance 5.0 Volts DC. Such increase in voltage may cause the power amplifier to dissipate more power internally, resulting in more heat being generated and increasing its operating temperature. This may result in the power amplifier operating beyond its designed limits and lead to its failure.

Accordingly, there is a need for a method and/or apparatus to protect power amplifiers from failure caused by mismatched loads and/or large supply voltages.

DETAILED DESCRIPTION OF THE INVENTION

Figure 1A:
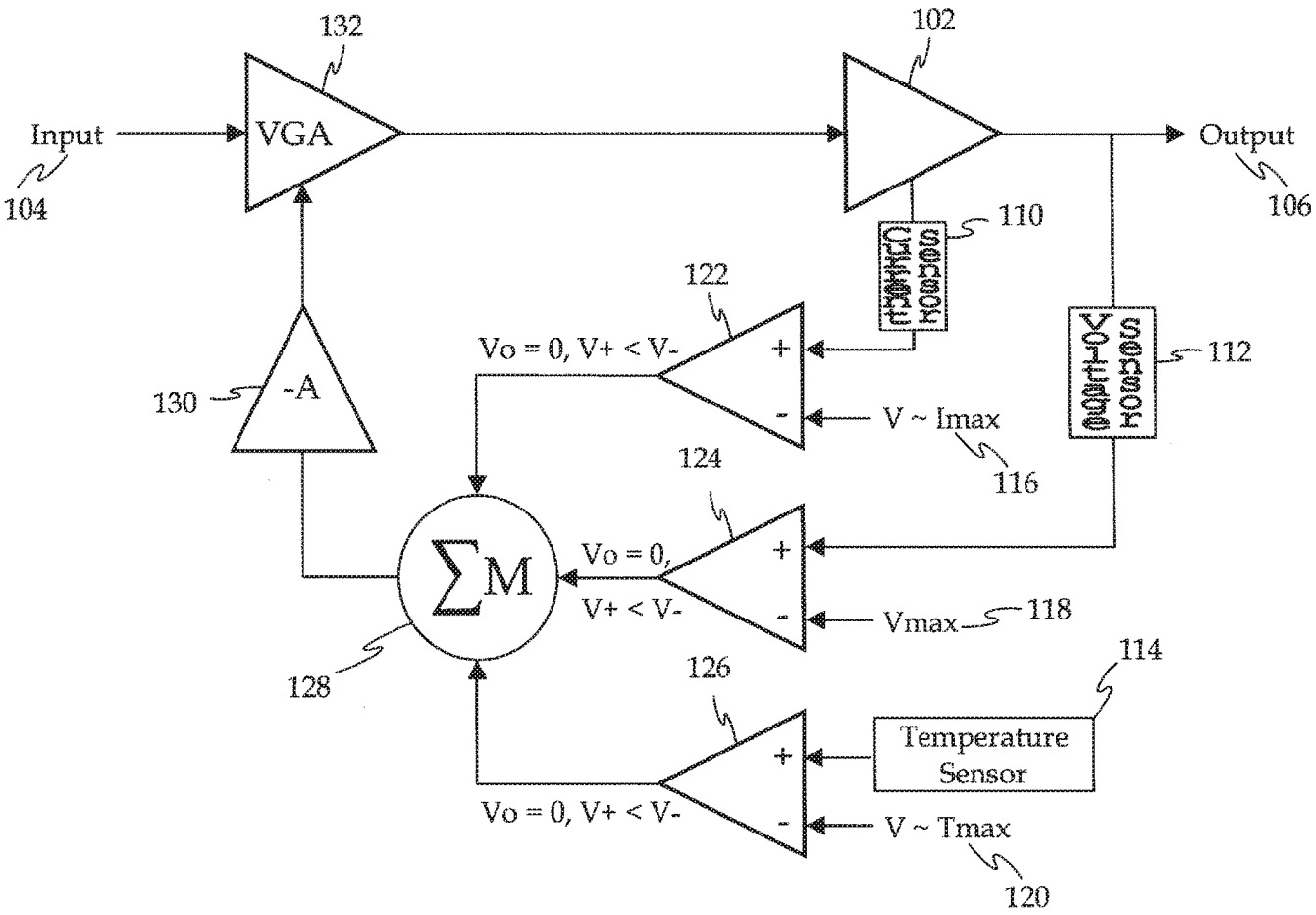
FIG. 1A shows a system-level diagram illustrating a first embodiment of the power amplifier protection system of the present invention.

Referring to FIG. 1A, a high-level system diagram is shown illustrating a first embodiment the power amplifier protection system of the present invention. A power amplifier 102 amplifies a given input signal 104 and provides an amplified output signal 106. In one embodiment, the power amplifier 102 may be a radio frequency (RF) non-linear power amplifier which may be employed in transmitting any number of broadcast signals at various transmission frequencies. In another embodiment, the RF power amplifier may be a linear power amplifier. According to various embodiments, the power amplifier may be designed to operate with a predetermined load impedance value, to dissipate no more than a maximum measure of power, and/or to operate below a maximum temperature level.

The present invention provides a protection system to guard against power amplifier failure due to excessive power dissipation and/or operating temperatures. A feedback loop is employed for this purpose, wherein the power of the input signal to the power amplifier, or one stage of the power amplifier, is regulated, varied, or reduced to cause the power amplifier to operate within specified limits when necessary. This failure protection system may be comprised of a plurality of components.

One or more sensing means or devices may be employed to sense certain operating conditions of a power amplifier. For instance, the present invention may provide a current sensing means 110 and a voltage sensing means 112 to sense or measure the current and voltage at the output of the power amplifier 102. The current and voltage sensing means 110 and 112 may be any one of a number of circuits and/or devices conventionally known to those skilled in these arts.

In various embodiments, the current sensing means 110 may sense the current drawn from the amplifier's power source, the current through a transistor in the power amplifier, and/or the output current of the power amplifier. According to one embodiment, the current sensing means 110 may comprise a resistor of known value such that the current is proportional to the voltage across the resistor. In a second embodiment, a conventional current mirror comprising two transistors in parallel may be employed. With said current mirror, the collector currents may be proportional to the emitter areas. The two transistors may be selected such that one transistor has a small emitter area in comparison to the second transistor, Thus, the transistor with the smallest emitter area would function as a current sensing means without draining any significant power from the power amplifier 102.

In one embodiment, the current sensing means may provide a voltage corresponding to the current sensed. In a second embodiment, the current sensing means may provide a voltage that is linearly proportional to the current sensed.

According to one implementation, the voltage sensing means 112 may comprise a rectifier, or other peak-detection device, to provide the peak output voltage. In a second implementation, the voltage sensing means 112 may comprise a circuit or device to measure the average output voltage.

The present invention may further provide a temperature sensing means 114 to sense or measure the operating temperature of the power amplifier 102. The internal temperature and/or external temperature of the power amplifier 102 may be sensed, measured, and/or quantified by the temperature sensing means 114. The temperature sensing means 114 may be any one of a number of conventional temperature sensing or measuring circuits or devices. According to one embodiment, the temperature sensing means 114 may comprise one or more transistors configured to sense a voltage which is proportional to absolute temperature.

The voltages, currents, and temperatures sensed, measured, or quantified, may then be utilized to determine if the power amplifier is operating beyond acceptable, desired, or specified limits or levels. If any one of the operating conditions is beyond the desired operating level or threshold value, then a feedback system may regulate, dynamically or otherwise, the power of the input signal to the power amplifier.

The current sensing means 110, which provides a voltage corresponding to the current sensed, is coupled to a first input terminal of a first differential amplifier 122 while a first reference voltage source 116 is coupled to a second input terminal of the first differential amplifier 122. The first reference voltage source 116 may provide a threshold voltage corresponding to a desired current through the power amplifier 102. In one implementation, this threshold voltage may correspond to the maximum output current specified for the power amplifier 102.

Similarly, the voltage sensing means 112 is coupled to a first input terminal of a second differential amplifier 124 while a second reference voltage source 118 is coupled to a second input terminal of the second differential amplifier 124. The second reference voltage source 118 may provide a threshold voltage corresponding to a desired output voltage for the power amplifier 102. In one implementation, this threshold voltage may correspond to the maximum output voltage specified for the power amplifier 102.

Likewise, the temperature sensing means 114, which may provide a voltage corresponding to the sensed temperature, is coupled to a first input of a third differential amplifier 126 while a third reference voltage source 120 is coupled to a second input of the third differential amplifier 126. The third reference voltage source 120 may provide a threshold voltage corresponding to a desired operating temperature for the power amplifier 102. In one implementation, this threshold voltage may correspond to the maximum operating temperature specified for the power amplifier 102.

Any of the reference voltage sources 116, 118, and 120 may be configurable and/or variable. In various implementations, one or more of the reference voltage sources 116, 118, and 120 may provide a predetermined threshold voltage level or a dynamically changing voltage level.

While the sensed conditions do not exceed their corresponding reference or threshold voltage levels, the differential amplifier does not provide a regulating feedback signal to the power amplifier.

According to one embodiment, each differential amplifier 122, 124, and 126 may provide a first output voltage level if the voltage at its first input terminal is less than the voltage at its second input terminal. Otherwise, each differential amplifier may provide a second output voltage level if the voltage at its first input terminal is greater than or equal to the voltage at its second input terminal. The magnitude of the second output voltage level may vary during operation according to a change in the voltage at the first input terminal of the differential amplifier 122, 124, and 126.

In one embodiment, the first, second, and third differential amplifiers 122, 124, and 126 may provide a fixed first output voltage level, zero volts for example, if the voltages corresponding to the sensed current 110, voltage 112, and temperature 114 are less than the corresponding voltage at the first, second, and third reference voltage sources 116, 118, and 120. Otherwise, if one or more of the voltages corresponding to the sensed current 110, voltage 112, and/or temperature 114 is greater than or equal to the corresponding reference voltages at the first, second, and third reference voltage sources 116, 118, and 120, then the corresponding differential amplifier may provide a positive, or negative, voltage output.

In one embodiment, the output terminals of the differential amplifiers 122, 124, and 126 are coupled to a maximum follower means 128. The maximum follower means 128 may be any one of a number of conventionally known circuits or devices which is capable of selecting, from among a plurality of inputs, a single input with the greatest absolute voltage value, and providing said greatest voltage value at an output terminal of the maximum follower means 128. According to one embodiment, the maximum follower means 128 may comprise three emitter followers whose emitters are coupled together.

The output of the maximum follower means 128 may be coupled to a loop amplifier means 130. The loop amplifier means 130 may be any one of a number of conventionally known voltage amplifiers.

According to one implementation, the loop amplifier means 130 may, in turn, be coupled to a variable gain amplifier (VGA) 132 so as to vary the power of a signal passing to and/or through the VGA 132. The VGA 132 may receive an input signal 104 and provide the signal, or a modified version of the signal, as its output. The VGA 132 may be any one of a number of conventionally known variable gain amplifiers capable of varying the power of a signal passing through the VGA 132. In one implementation, the VGA 132 may vary the signal power by reducing the amplitude of the signal. In a second embodiment, the VGA 132 may vary the signal power by offsetting its DC voltage. In a third embodiment, the VGA 132 may vary both the signal amplitude and DC voltage offset to reduce the input signal power.

According to one embodiment, the output of the VGA 132 may be coupled to the input terminal of the power amplifier 102 to provide an input signal to the power amplifier 102. In this manner, the sensing means 110, 112, and 114, differential amplifier means 122, 124, and 126, maximum follower means 128, loop amplifier 130, and VGA 132 provide feedback compensation to the power amplifier 102. Such feedback loop may function to vary the power and/or amplitude of the input signal to the power amplifier 102 so that it operates within specified power dissipation and/or temperature levels.

Figure 1B:
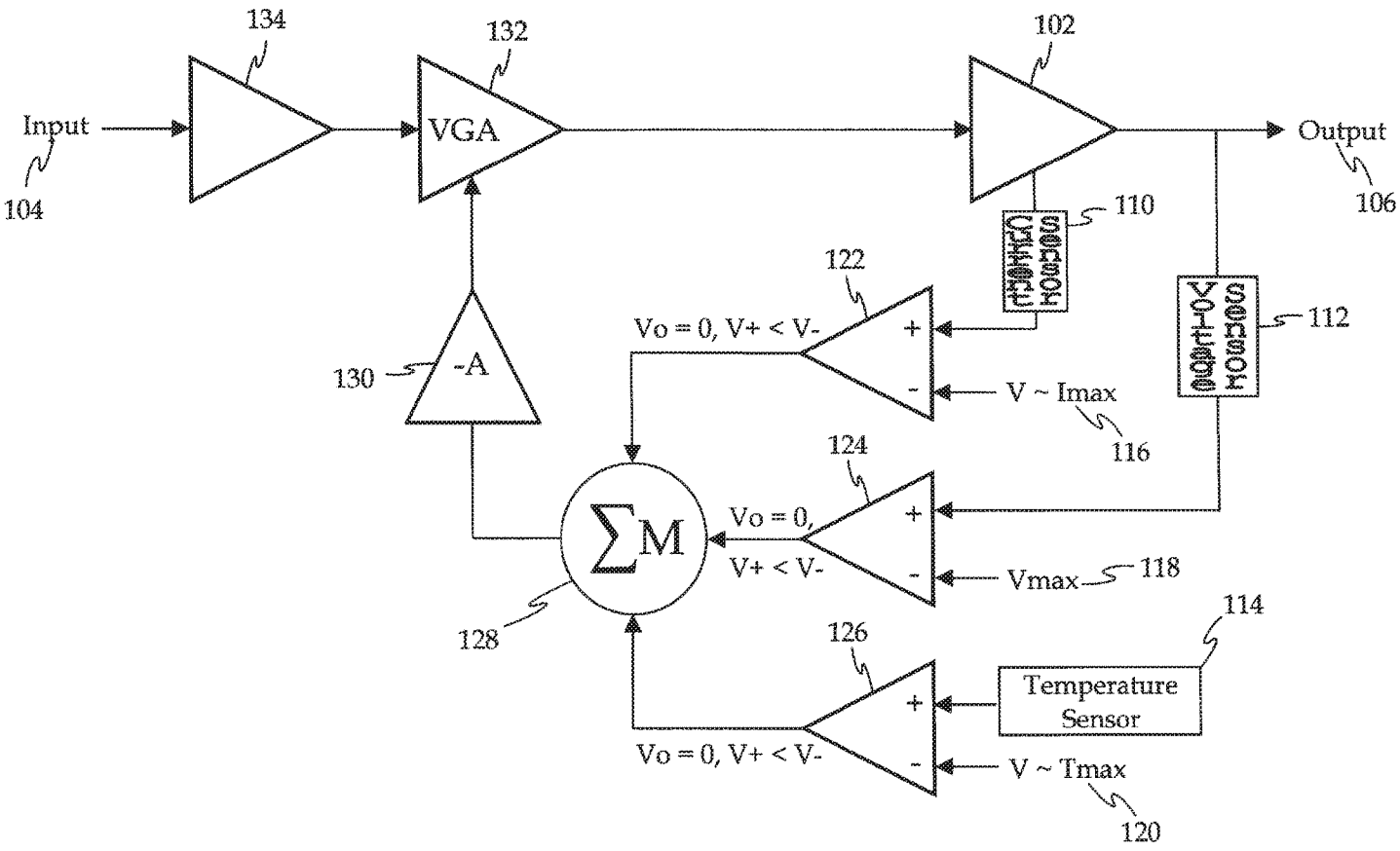
FIG. 1B shows a system-level diagram illustrating a second embodiment of the power amplifier protection system of the present invention.

FIG. 1B shows a second embodiment of the present invention illustrating how the present invention may be practiced in a multi-stage power amplifier. In this configuration, a first stage amplifier 134 has its output coupled to the input of a variable gain amplifier (VGA) 132 which, in turn, has its output coupled to the input of a second stage amplifier 102. The current sensing means 110 and voltage sensing means 112, coupled to the second stage amplifier 102, and a temperature sensing means 114 provide feedback to the VGA 132. By said feedback, the amplitude or DC offset level of the signal passing through the VGA 132 may be varied so that the power amplifier operates 102 within specified power dissipation and/or temperature levels.

The feedback circuit, including differential amplifiers 222, 224, and 126, reference voltage sources 116, 118, and 120, maximum follower 228, and loop amplifier 130, operate as described with reference to FIG. 1A.

While the embodiment shown in FIG. 1B shows a VGA 132 between two stages of an amplifier, the present invention is not limited by the number of stages of an amplifier nor by the placement of the VGA 132 within said amplifier.

Figure 1C:
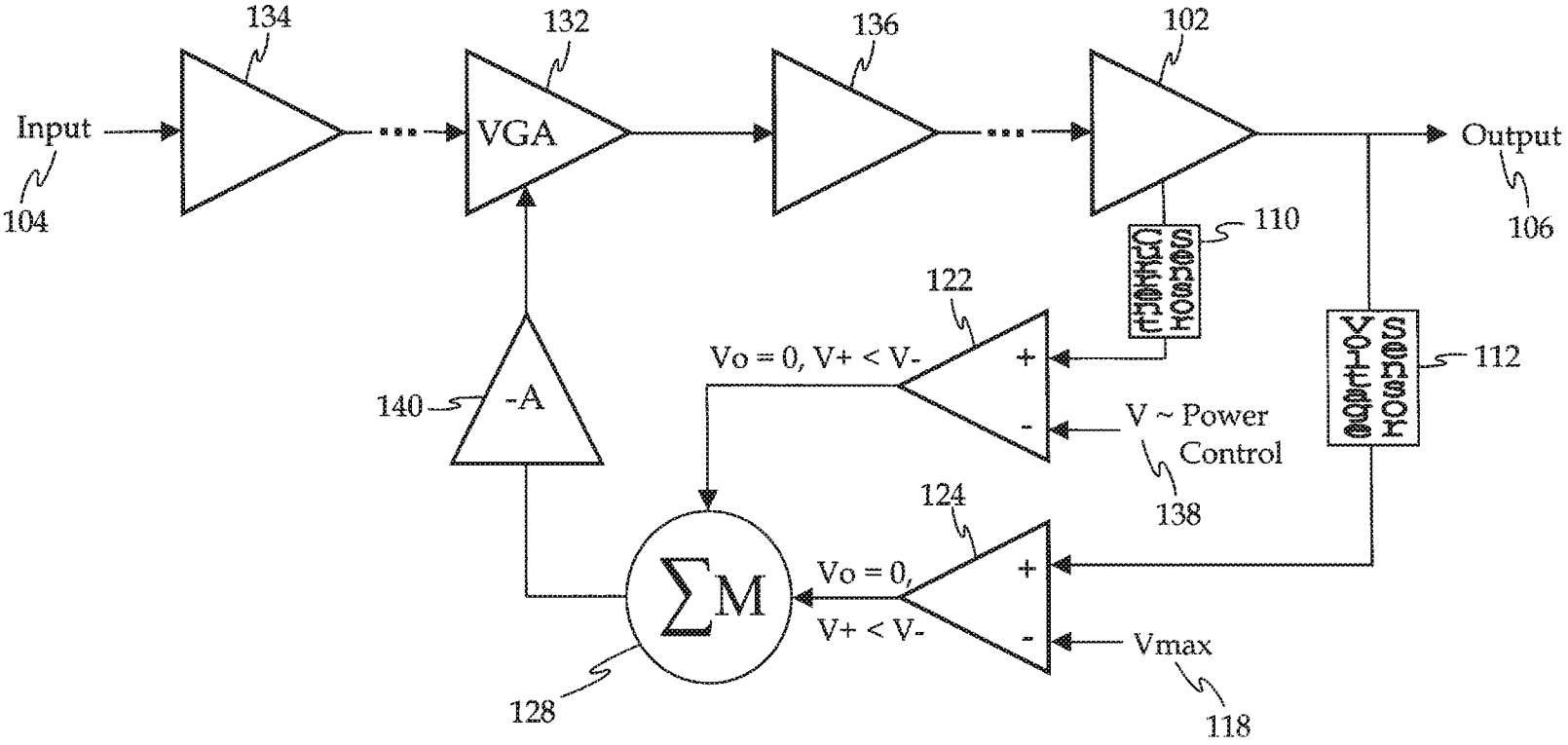
FIG. 1C shows a system-level diagram illustrating a third embodiment of the power amplifier protection system of the present invention.

For instance, FIG. 1C illustrates another embodiment of the present invention where an amplifier with at least three-stages is employed. The output terminal of a first stage amplifier 134 may be coupled to the input terminal of a VGA 132. The output terminal of the VGA 132 may be coupled to the input terminal of a second stage amplifier 136. The output terminal of the second stage amplifier 136 may be coupled to the input terminal of a third stage amplifier 102. This invention may be practiced with a power amplifier comprising a plurality of stages, even in excess of the number of stages illustrated.

The present invention is not limited by the number of sensing means and may be practiced with one or more sensing means. According to one embodiment, shown in FIG. 1C, two sensing means, a voltage sensing means 112 and a current sensing means 110, may be employed. In various other embodiments, the invention may include a voltage sensing means, a current sensing means, and/or a temperature sensing means or any combination of the three. Other sensing means, such as a flux sensing means, may also be employed to gather the desired operating conditions of a power amplifier. In one embodiment, the output power of the power amplifier is sensed by a forward directional coupler. In the case where a single sensing means is employed, the maximum follower means 140 may be removed from the feedback circuit.

Additionally, the present invention may provide a power control means 138 as part of the failure protection system. The power control means 138 may be accomplished using any one of the sensing means employed by the power amplifier. According to one configuration, this may be accomplished by coupling the current sensing means 110 to a first input terminal of a differential amplifier 122 and coupling a reference voltage source 138 to a second input terminal of the differential amplifier 122. The reference voltage source 138 may be configurable and/or variable so that it may be preset and/or dynamically adjusted. While the voltage level the first input terminal is less than the voltage level at the second input terminal, the differential amplifier 122 may provide a first voltage level at its output terminal. Otherwise, if the voltage level at the first input terminal is greater than or equal to the voltage level at the second input terminal, then the differential amplifier 122 may provide a second voltage level at its output terminal. In one implementation, the first voltage level may be zero volts while the second voltage level may be the same voltage level as is present at the first input terminal of the differential amplifier 122.

The output terminal of the differential amplifier 122 may be coupled to the VGA 132, either directly or indirectly, for instance via a maximum follower means 128 and loop amplifier means 140, to the VGA 132 to vary the power of the signal. In one embodiment, the signal power may be varied by changing the amplitude of the signal so that the power amplifier operates within certain power dissipation and/or temperature levels.

The present invention is also not limited to the placement of the VGA 132 between certain stages of a power amplifier. In various embodiments of the present invention which utilize a VGA, the VGA may be placed anywhere along the signal path either before, after, or between one or more power amplifier stages.

Figure 1D:
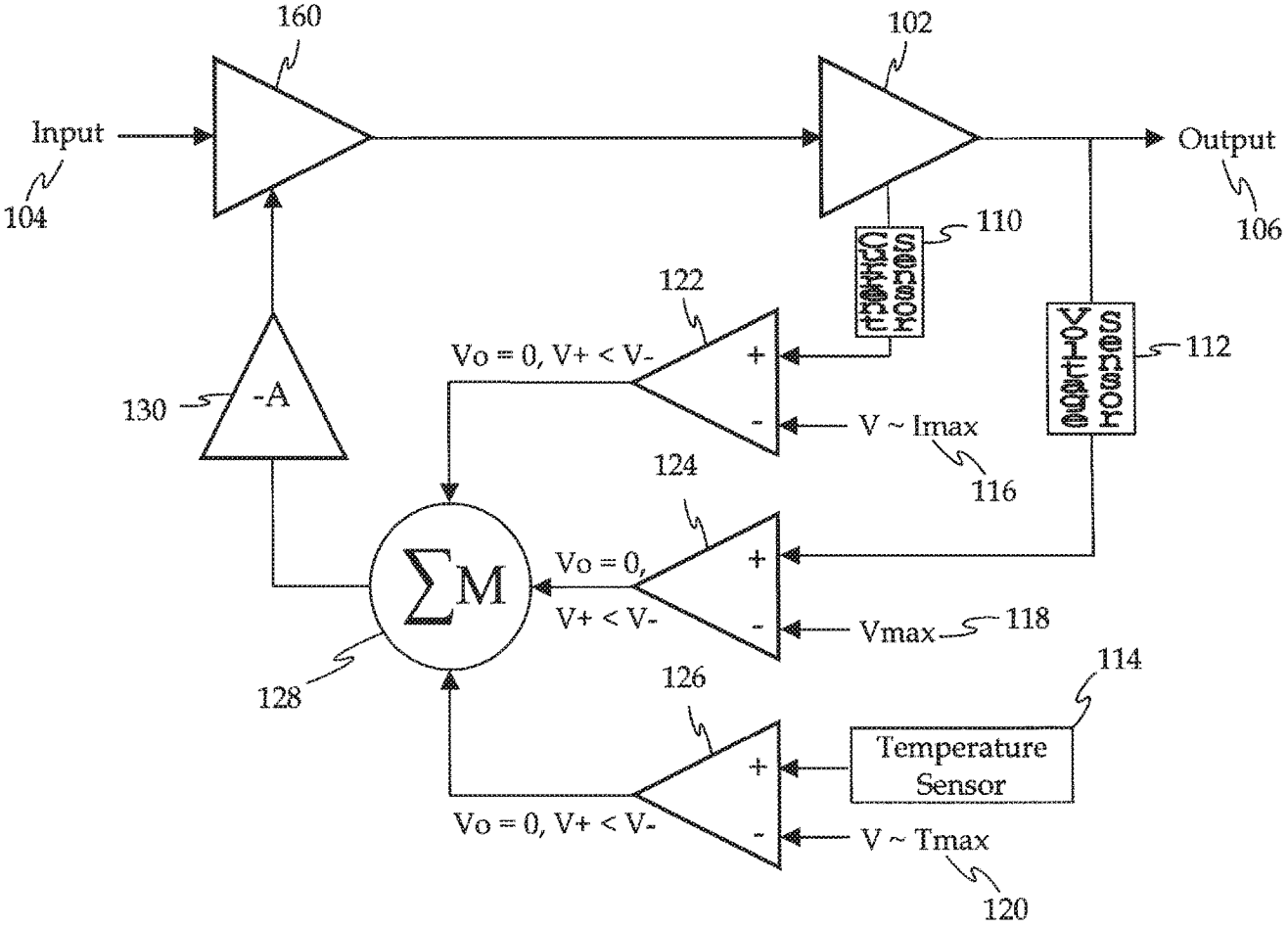
FIG. 1D shows a system-level diagram illustrating a fourth embodiment of the power amplifier protection system of the present invention.

In other embodiments, the present invention may be practiced without employing a VGA along the feedback path. As shown in FIG. 1D, the protection system may operate directly on a power amplifier stage 160 to vary the gain of the amplifier stage 160 and affect the power of the signal passing through the amplifier stage 160. In one embodiment, the feedback signal to the power amplifier stage 160, may operate to offset the signal's DC bias point at that stage. According to a second embodiment, the power amplifier stage 160 may incorporate the functions of a variable gain amplifier. Note that the power amplifier stage 160 may be any stage along the power amplifier.

Figure 1E:
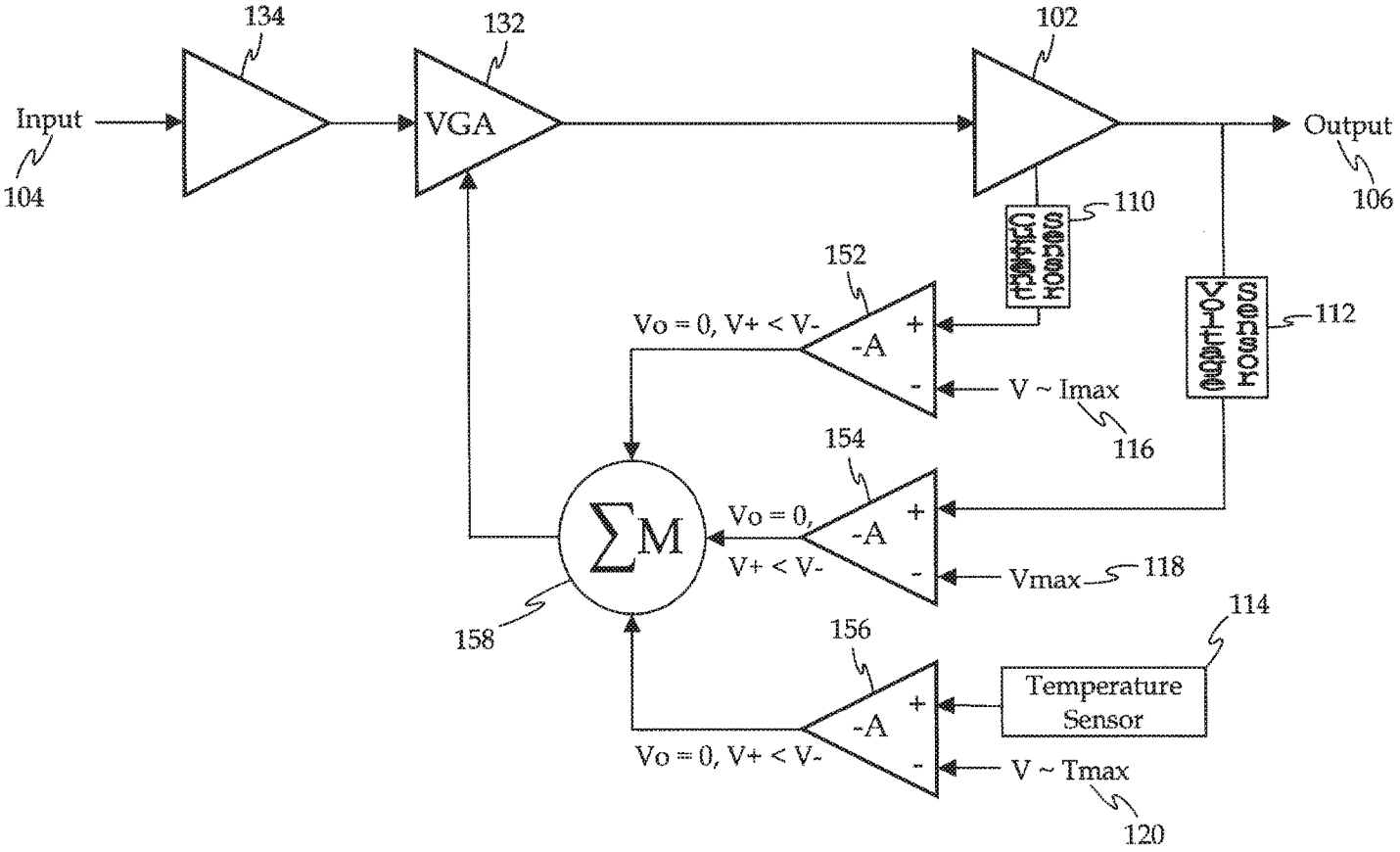
FIG. 1E shows a system-level diagram illustrating a fifth embodiment of the power amplifier protection system of the present invention.

Although a few embodiments of the power amplifier protection system of the present invention have been illustrated, this system may be implemented in numerous other forms without deviating from the invention. For instance, as shown in FIG. 1E, the loop compensation amplifier may be built into the differential amplifiers 152, 154, and 156 thereby removing the need for a separate loop compensation amplifier after the maximum follower means 158.

In various embodiments, the power amplifier protection system of the present invention may be a separate device or module or be incorporated within a power amplifier device.

Figure 2:
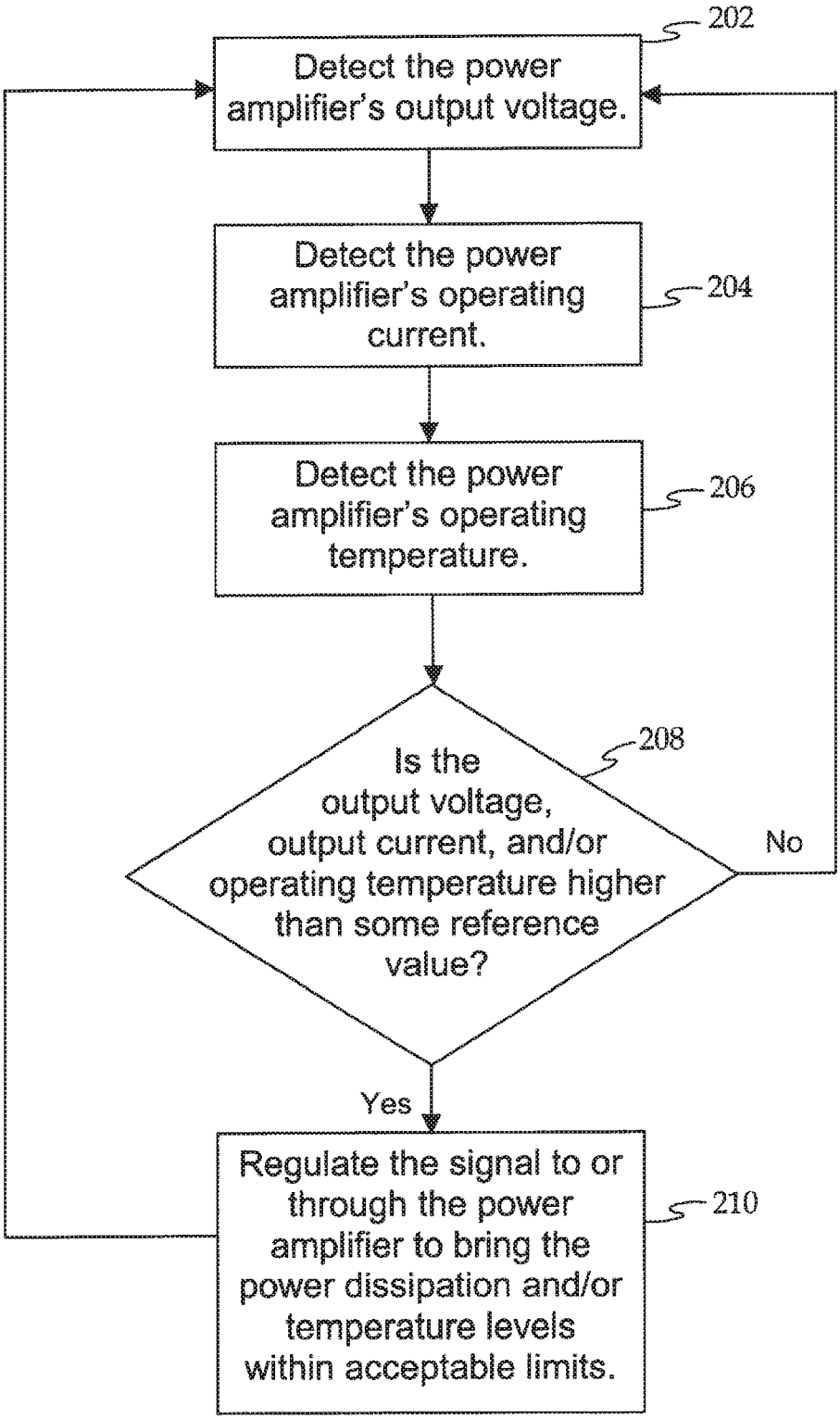
FIG. 2 shows a flow chart illustrating one method of practicing the power amplifier protection system of the present invention.

FIG. 2 illustrates one method of practicing the power amplifier protection system of the present invention. According to this embodiment, the desired operating conditions are sensed or measured. For instance, the power amplifier's output voltage 202, current passing through the amplifier 204, and/or operating temperature 206 values may be obtained. One or more of these values may be compared to some reference operating values to determine if the power amplifier is operating outside the desired limits 208. If it is not, then the failure protection system repeats this process.

If any one of the operating conditions is outside the desired limits, then the power of the input signal to the power amplifier is modified or varied to bring the power amplifier within the desired operating limits 210. In one embodiment, varying or regulating the power of the input signal may comprise reducing the amplitude of the input signal.

The power amplifier protection system described herein may be completely or partially practiced in various forms including, but not limited to, integrated circuit devices, programmable devices, machine-readable media, and/or a software program.

While the invention has been described and illustrated in detail, it is to be clearly understood that this is intended by way of illustration and example only and is not to be taken by way of limitation, the spirit and scope of this invention being limited only by the terms of the following claims.

What is claimed is:

1. A method for protecting a power amplifier comprising:

sensing two or more operating conditions of [a] *the* power amplifier selected from the group consisting of temperature, current and output voltage;

comparing the sensed temperature, current, and output voltage operating conditions to specified operating limits for [the] *a* respective operating conditions; and reducing [the] *a* power of an input signal to the power amplifier if one or more of the operating conditions is beyond specified operating limits for the power amplifier.

2. The method of claim 1 wherein the current is the amplifier current.

3. The method of claim 1 wherein the current is the current through a transistor in the amplifier.

4. A method for protecting a power amplifier comprising:

sensing temperature, current and output voltage of the power amplifier;

comparing the sensed temperature, current, and output voltage operating conditions to specified operating limits for [the] respective operating conditions; and reducing [the] *a* power of an input signal to the power amplifier if one or more of the operating conditions is beyond specified operating limits for the power amplifier.

5. The method of claim 4 wherein the current is the amplifier current.

6. The method of claim 4 wherein the current is the current through a transistor in the amplifier.

7. A power amplifier protection system comprising:

a first sub-system to sense temperature, current, and output voltage operating conditions of a power amplifier; and a second sub-system to regulate [the] *a* power of an input signal to the power amplifier in response to the sensed temperature, current, and output voltage operating conditions exceeding specified operating limits, respectively, and a third sub-system to compare the sensed temperature, current, and output voltage operating conditions of the power amplifier to specified operating limits, respectively.

*8. The method of claim 1 wherein the power amplifier comprises at least two amplifiers.*

*9. The method of claim 8 comprising a first amplifier within the at least two amplifiers, the first amplifier configured to receive the input signal of the power amplifier.*

*10. The method of claim 9 wherein the first amplifier is a variable gain amplifier coupled to receive the input signal.*

*11. The method of claim 8 comprising a first amplifier and a second amplifier within the at least two amplifiers, the first and second amplifiers coupled in series.*

*12. The method of claim 11 wherein the second amplifier is coupled to receive the input signal.*

*13. The method of claim 8 wherein the step of sensing two or more operating conditions of the power amplifier is performed on at least one sensing operation on an output signal of the power amplifier.*

*14. The method of claim 8 wherein the step of sensing two or more operating conditions of the power amplifier is performed on at least one sensing operation on an internal signal of the power amplifier.*

*15. The method of claim 8 wherein the power amplifier operates with a predetermined load impedance value.*

*16. The method of claim 8 further comprising a step of feeding back a plurality of values from the two or more sensed operating conditions, the plurality of fed back values being transmitted on at least two partially distinct feedback loop paths.*

*17. The method of claim 16 wherein the feedback loop is coupled between an output of the power amplifier and an initial stage of the power amplifier.*

*18. The method of claim 16 wherein the feedback loop is coupled between an output of the power amplifier and an intermediate stage of the power amplifier.*

*19. The method of claim 16 wherein current is sensed using a sensor selected from a group consisting of sense resistor, current mirror, an integrated current sensor and a voltage sensor that provides a voltage based on a sensed current.*

*20. The method of claim 16 further comprising a step of amplifying the plurality of fed back values using a plurality of amplifiers.*

*21. The method of claim 20 wherein an amplification across the plurality of amplifiers varies based on a signal magnitude of at least a first fed back value within the plurality of fed back values.*

*22. The method of claim 8 wherein the sensed temperature is detected internally within the power amplifier.*

*23. The method of claim 8 wherein at least one sensed operating condition is amplified and fed back to a first amplifier within the at least two amplifiers.*

*24. The method of claim 8 wherein the at least two amplifiers comprise a multi-stage power amplifier.*

*25. The method of claim 24 wherein the two or more sensed operating conditions are fed back within the multi-stage power amplifier, the two or more sensed operating conditions result in an adjustment to a gain value of a gain stage within the multi-stage power amplifier.*

*26. The method of claim 25 wherein the gain stage is an internal amplifier within the multi-stage power amplifier.*

*27. The method of claim 25 wherein the gain stage is a first amplifier within the multi-stage power amplifier.*

*28. The power amplifier protection system of claim 7 wherein the first sub-system, the second sub-system and the third sub-system are integrated within a multi-stage power amplifier.*

*29. The power amplifier protection system of claim 28 comprising a first amplifier within the multi-stage power amplifier, the first amplifier configured to receive the input signal of the power amplifier.*

*30. The power amplifier protection system of claim 29 wherein the first amplifier is a variable gain amplifier coupled to receive the input signal.*

*31. The power amplifier protection system of claim 28 comprising a first amplifier and a second amplifier within the multi-stage power amplifier, the first and second amplifiers coupled in series.*

*32. The power amplifier protection system of claim 31 wherein the second amplifier is coupled to receive the input signal.*

*33. The power amplifier protection system of claim 28 wherein the current is sensed on an internal signal of the power amplifier.*

*34. The power amplifier protection system of claim 28 wherein the multi-stage power amplifier operates with a predetermined load impedance value.*

*35. The power amplifier protection system of claim 28 further wherein the second and third sub-systems are integrated within a feedback loop controlling a gain of at least one amplifier within the multi-stage power amplifier.*

*36. The power amplifier protection system of claim 35 wherein the feedback loop is coupled between an output of the multi-stage power amplifier and an initial stage of the multi-stage power amplifier.*

*37. The power amplifier protection system of claim 35 wherein the feedback loop is coupled between an output of the multi-stage power amplifier and an intermediate stage of the multi-stage power amplifier.*

*38. The power amplifier protection system of claim 28 wherein current is sensed using a sensor selected from a group consisting of sense resistor, current mirror, an integrated current sensor and a voltage sensor that provides a voltage based on a sensed current.*

*39. The power amplifier protection system of claim 28 further comprising a plurality of amplifiers within a feedback loop coupled between an output of the multi-stage power amplifier and an initial stage of the multi-stage power amplifier, the feedback loop controlling at least one gain value associated with the multi-stage power amplifier.*

*40. The power amplifier protection system of claim 28 further comprising a plurality of amplifiers within a feedback loop coupled between an output of the multi-stage power amplifier and an intermediary stage of the multi-stage power amplifier, the feedback loop controlling at least one gain value associated with the multi-stage power amplifier.*

* * * * *